United States Patent [19]
Abe

[11] Patent Number: 5,196,999
[45] Date of Patent: Mar. 23, 1993

[54] ELECTROSTATIC LEVITATION FURNACE

[75] Inventor: Toshio Abe, Kanagawa, Japan

[73] Assignee: Mitsubishi Denki Kabushiki Kaisha, Japan

[21] Appl. No.: 550,679

[22] Filed: Jul. 10, 1990

[30] Foreign Application Priority Data

| Jul. 13, 1989 | [JP] | Japan | 1-181298 |
| Jul. 14, 1989 | [JP] | Japan | 1-181942 |
| Jul. 26, 1989 | [JP] | Japan | 1-193075 |
| Jul. 27, 1989 | [JP] | Japan | 1-194597 |
| Aug. 19, 1989 | [JP] | Japan | 1-213213 |

[51] Int. Cl.$^5$ .......................................... G06F 15/20
[52] U.S. Cl. ................................. 364/400; 219/7.5; 219/121.36; 361/143; 364/477
[58] Field of Search ............... 364/400, 477, 130, 183; 73/505; 219/7.5; 121.36–121.59; 361/143, 233; 156/DIG. 62

[56] References Cited

U.S. PATENT DOCUMENTS

| 4,521,854 | 6/1985 | Rhim et al. | 364/400 |
| 4,536,640 | 2/1985 | Uukanovic | 219/121.48 X |
| 4,688,141 | 2/1987 | Bernard et al. | 361/233 |

OTHER PUBLICATIONS

Rhim et al.-"Development of an Electrostatic Positioner for Space Material Processing"—Rev. Sci. Instrum. 56(2), Feb. 1985; pp. 307–317.

Eyer et al.-"A Double-Ellipsoid Mirror Furnace for Zone Crystallization Experiments in Spacelab",—Journal of Crystal Growth—vol. 47, No. 8, Aug. 1979; pp. 219–229.

Rhim et al.-"Large Charged Prop Levitation Against Gravity"-1986 IEEE Industry Applications Society Annual Meeting: Conference Record; vol. 2, 1986, pp. 1338–1341.

Primary Examiner—Joseph Ruggiero
Attorney, Agent, or Firm—Wolf, Greenfield & Sacks

[57] ABSTRACT

An electrostatic levitation furnace is used for production of microgravity material in space. The furnace comprises a rotary elliptical mirror having a reflection surface of a rotary elliptical body at the inside; a plasma lamp disposed at a first focal point of the rotary elliptical mirror; a member for supporting the plasma lamp; an electric wave shielding plate of a disc type attached adjacent to the first focal point of the rotary elliptical mirror in such a manner that the circumferential edge of the plate is in contact with the inner surface of the mirror; a cavity resonator defined by the rotary elliptical mirror and the electric wave shielding plate, and adapted to accommodate the plasma lamp; a high frequency generator for supplying a high frequency current to the cavity resonator; a test sample disposed at a second focal point of the rotary elliptical mirror; transparent electrodes disposed in the rotary elliptical mirror for providing an electric field allowing the test sample to be levitated; a high potential power source connected to the transparent electrodes; a position detector disposed oppositely to the test sample for detecting the position thereof; a control circuit connected to the position detector and the high potential power source for controlling an output level of the high potential power source in response to the detected position of the test sample; and a silica tube for accommodating the test sample.

24 Claims, 22 Drawing Sheets

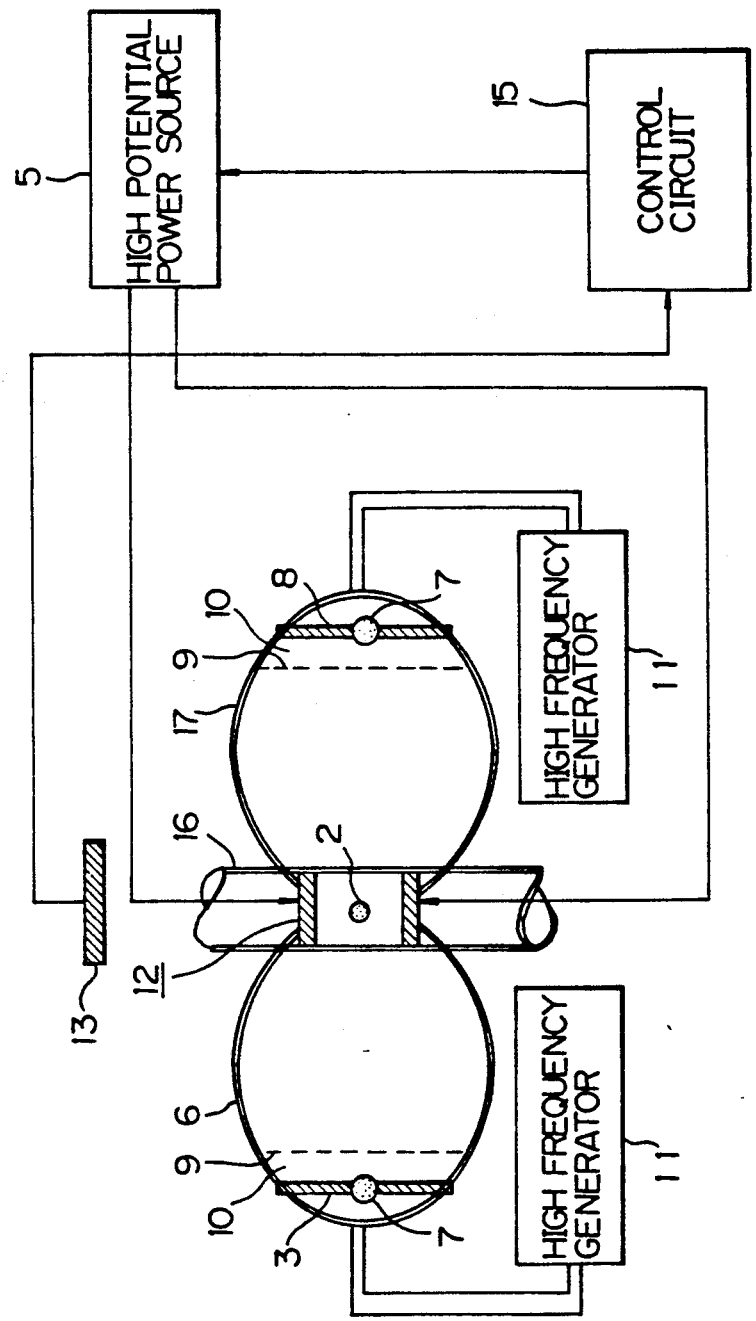

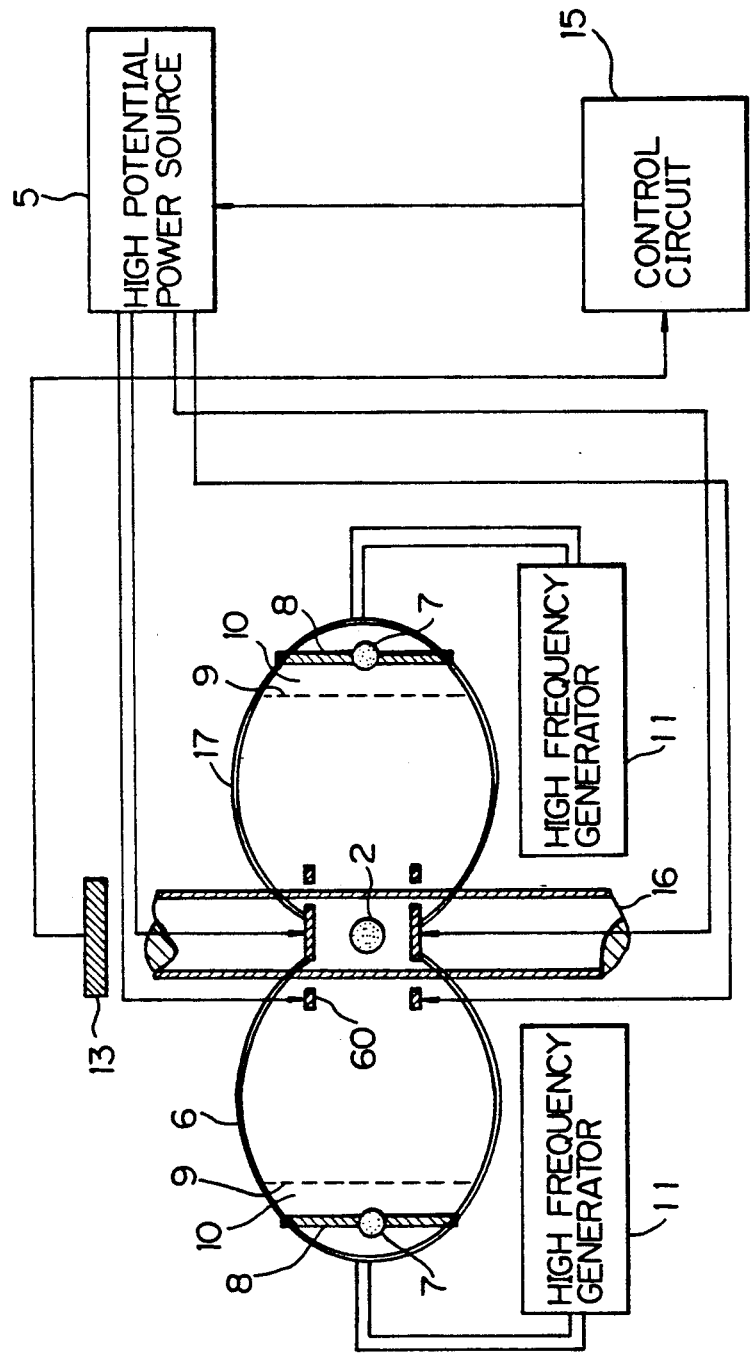

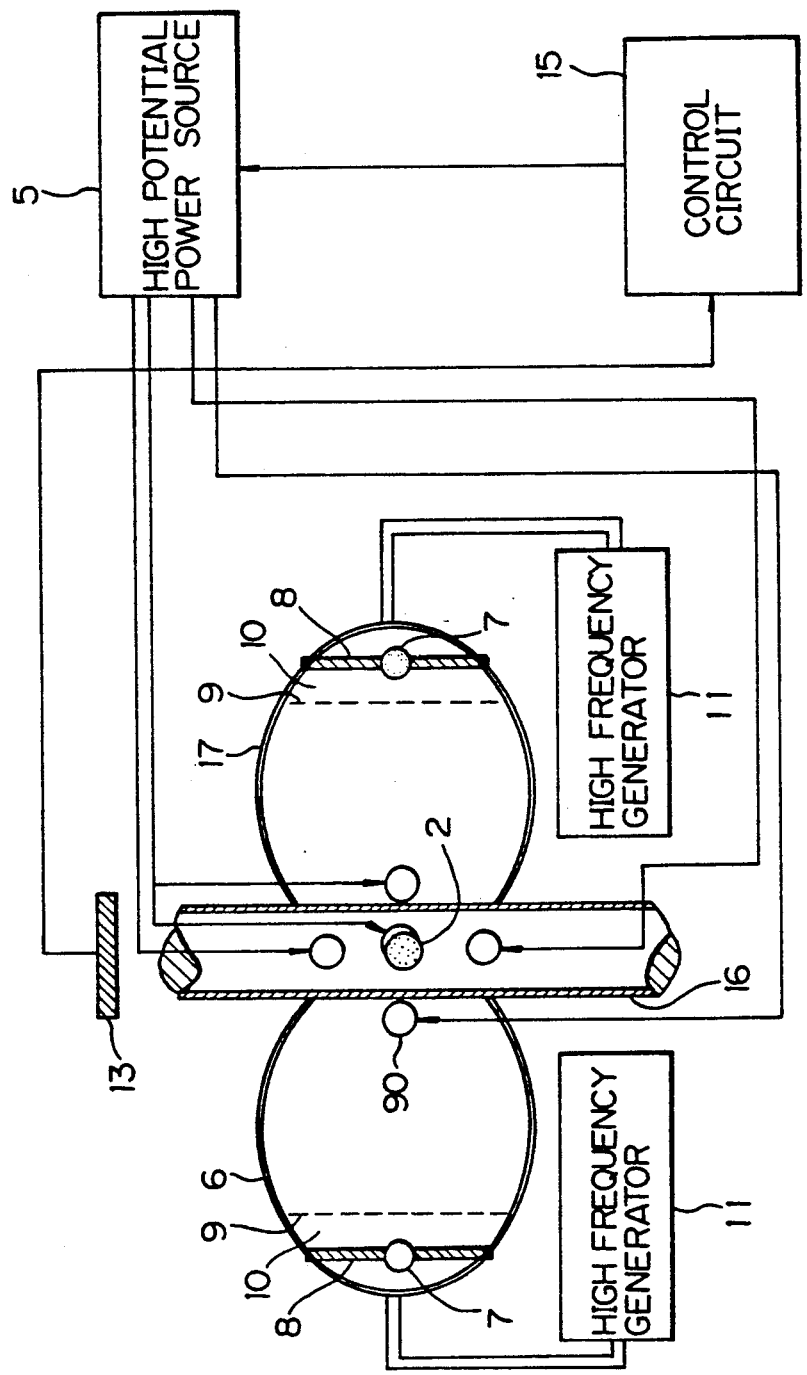

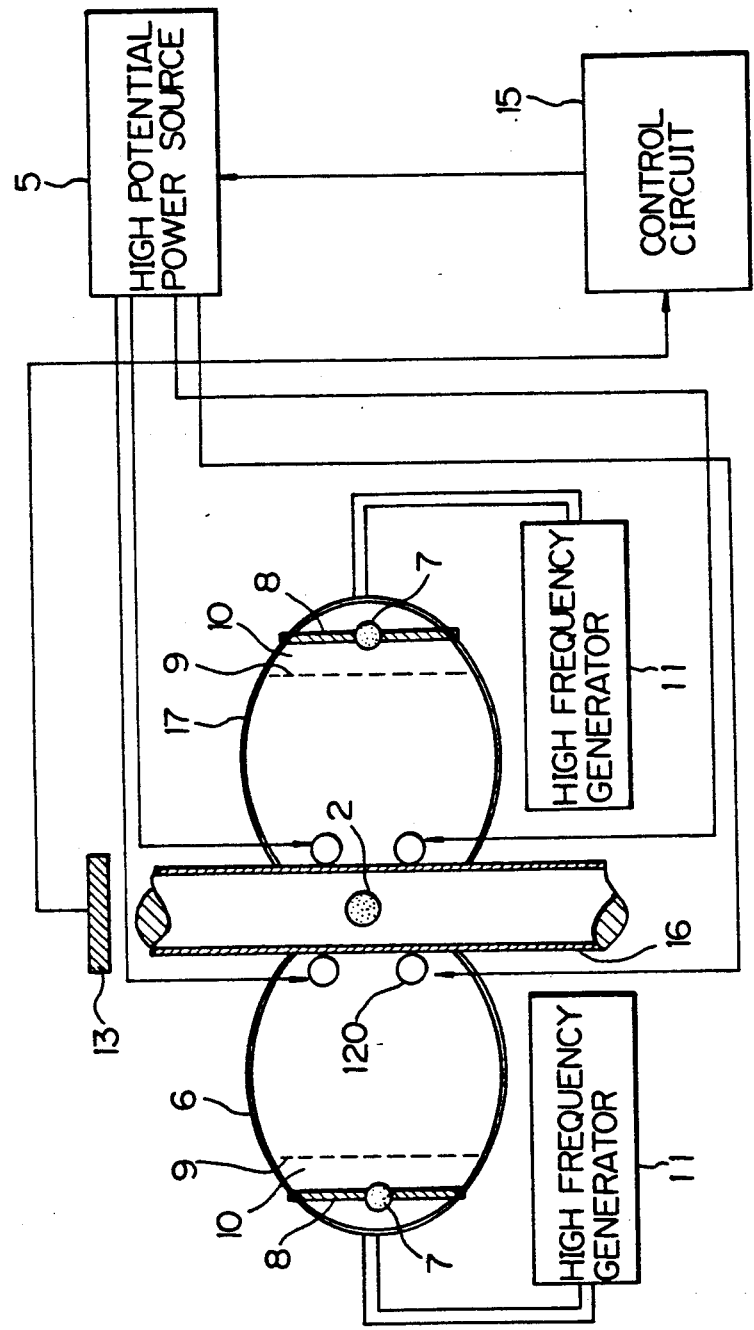

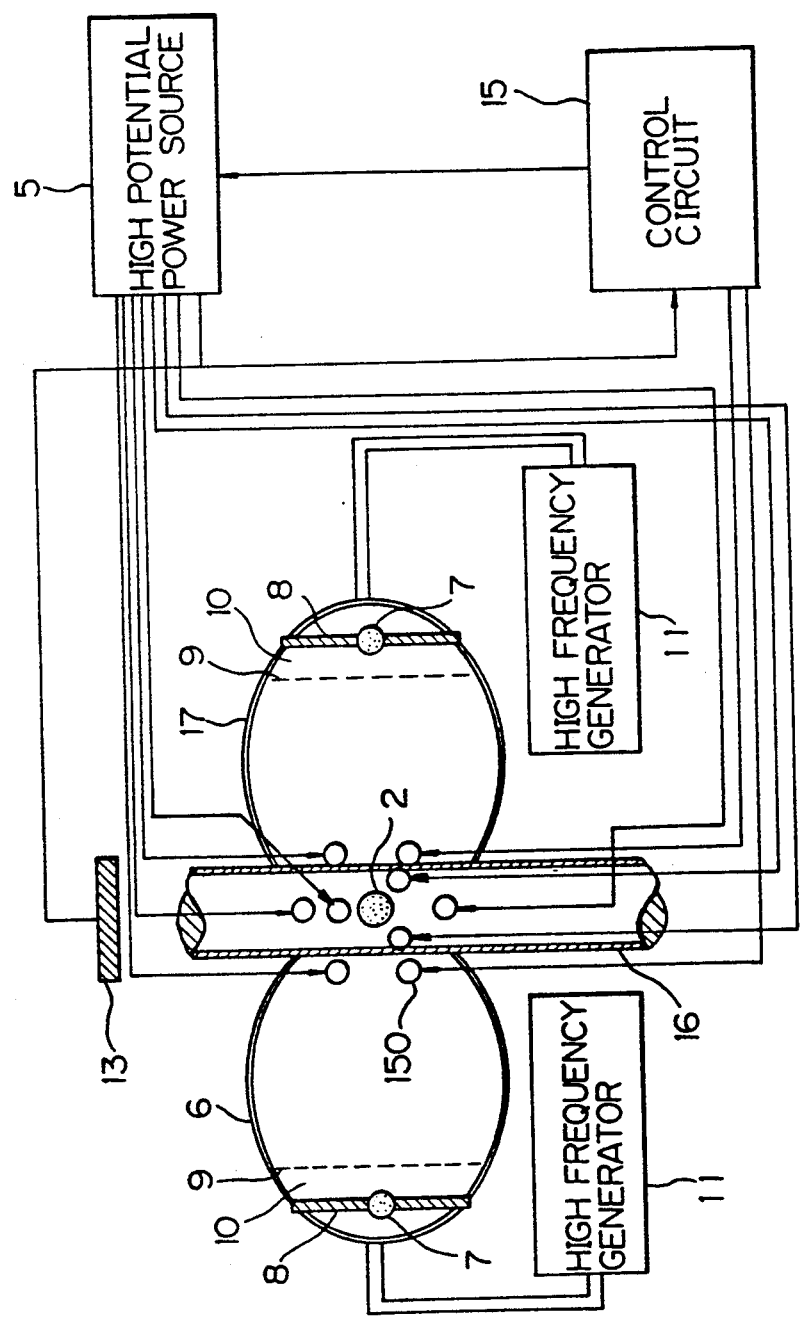

ELECTROSTATIC LEVITATION FURNACE

TECHNICAL FIELD OF UTILIZATION

The present invention relates to an improvement of an electrostatic levitation furnace to be used in an experiment of producing microgravity materials in which the crystal growth of, for example, semiconductor materials is facilitated in space.

DESCRIPTION OF PRIOR ARTS

FIG. 1 is a block diagram showing an electrostatic levitation furnace according to the prior art as illustrated in U.S. Pat. No. 4,521,854 (issued on Jun. 4, 1985), entitled "CLOSED LOOP ELECTROSTATIC LEVITATION SYSTEM". In FIG. 1, numeral 1 designates opposed electrodes in the form of a downwardly recessed dish shape. Numeral 2 designates a sample to be tested which is disposed at the location intermediate the opposed electrodes 1. Numeral 3 designates a CCD camera designed to measure the position of gravity of the test sample 2. Numeral 4 designates a control circuit connected to the CCD camera. Numeral 5 designates a high potential power source connected to both the control circuit 4 and the electrodes 1. It is to be noted that no other published literature was found which clearly discloses the constitution of an electrostatic levitation furnace.

Since the electrostatic levitation furnace according to the prior art as referred to above is of such a constitution, the stability of positional control of a test sample depends on the positional resolution of the CCD camera and the speed of computing the position of gravity, and hence the test sample may be vibrated depending on how much stability is attained. This sort of vibration is a very critical defect in microgravity experiments.

Furthermore, since the measurement of the position of the test sample is performed by binary coding the image data, there is a serious problem in that the measurement processing may be adversely affected by the background, possibly causing inability of detection.

In addition, since the position of the test sample is digitally computed, the number of components may be increased, thereby resulting in degradation of reliability of the entire system.

SUMMARY OF THE INVENTION

The present invention has been proposed in order to solve the problems as pointed out above. Accordingly, an object of the present invention is to provide an electrostatic levitation furnace wherein a position sensing device (PSD) of an analog type is employed in place of the CCD camera so as to detect the position at a high speed by analog signals whereby stability of the position of test sample can be extremely enhanced and irradiation of the light from a light source onto the surface of the test sample can be so stabilized that the temperature distribution over the surface of the sample can be uniform.

Another object of the present invention is to provide an electrostatic levitation furnace which employs two light sources and heats the test sample by a dual rotary elliptical mirror image.

A further object of the present invention is to provide an electrostatic levitation furnace wherein a plasma lamp is disposed in a cavity resonator formed in the rotary elliptical mirror, so that an electric wave is charged to the plasma lamp to irradiate it; the test sample accommodated in a silica tube is disposed in the spherical focused image; the test sample is levitated among unique electrodes; and a positional control of the test sample is executed by a position sensor of an analog type.

According to the present invention, the plasma lamp disposed at a first focal point of the rotary elliptical mirror is irradiated and condensed on the test sample disposed at a second focal point of the mirror to heat it, and the positional control of the test sample is executed in such a way that the position of the sample is detected by the analog position detector and the electric field is controlled by an analog system. Thus the position control can be stabilized. Furthermore, the test sample is heated in different ways by changing the pressure and the kind of the gas, which are contained in the silica tube.

According to the present invention, the position of the test sample can be detected at a high speed, or one thousand times as high as in the case of employing CCD, the vibration of the test sample can be reduced, and the stable levitation can be accomplished. Furthermore, since the position of the test sample is so stabilized, heating by the plasma lamp can be done evenly, resulting in uniform temperature distribution over the surface of the test sample.

This is very important in execution of microgravity experiments and makes it possible to realize the ideal microgravity experiment without external disturbance.

Further according to the present invention, since the electrodes of a transparent ring type are employed, the heating efficiency can be increased.

Still according to the present invention, since two pairs of electrodes of a transparent ring type are arranged outwardly and inwardly of the silica tube, the heating efficiency can be enhanced and also the outer electrodes of a transparent ring type enable the electric field to be expanded so that a larger test sample can be controlled in respect to levitation.

According to the present invention, five electrodes of transparent sphere type disposed at the apexes of a regular hexahedron are employed outwardly and inwardly of the silica tube, the heating efficiency can be high and since three electrodes of a transparent sphere type out of the five electrodes are disposed outwardly of the silica tube, the electric field can be expanded to allow a larger test sample to be controlled in respect of levitation.

According to the present invention, since light electrodes of a transparent sphere type disposed outwardly of the silica tube are employed, the heating efficiency can be increased and the electric field can be expanded to allow a larger test sample to be controlled in respect of levitation.

Further according to the present invention, twelve electrodes of a transparent sphere type disposed at the apexes of a regular icosahedron are employed outwardly and inwardly of the silica tube, the heating efficiency can be further increased and since ten electrodes of a transparent sphere type out of the twelve electrodes are disposed outwardly of the silica tube, the electric field can be expanded to allow a larger test sample to be controlled in respect of levitation.

Furthermore according to the present invention, since the gas in the silica tube can be controlled, various sorts of processing can be made applicable.

BRIEF EXPLANATION OF THE DRAWINGS

FIG. 18 is a block diagram illustrating the constitution of an electrostatic levitation furnace according to a sixth embodiment of the present invention constituted based on the first embodiment shown in FIG. 2;

FIG. 19 is a block diagram illustrating the constitution of an electrostatic levitation furnace according to a seventh embodiment of the present invention constituted based on the second embodiment shown in FIG. 6;

FIG. 20 is a block diagram illustrating the constitution of an electrostatic levitation furnace according to an eighth embodiment of the present invention constituted based on the third embodiment shown in FIG. 9;

FIG. 21 is a block diagram illustrating the constitution of an electrostatic levitation furnace according to a ninth embodiment of the present invention constituted based on the fourth embodiment shown in FIG. 14; and FIG. 22 is a block diagram illustrating the constitution of an electrostatic levitation furnace according to a tenth embodiment of the present invention constituted based on the fifth embodiment shown in FIG. 15.

DESCRIPTION OF PREFERRED EMBODIMENTS

An electrostatic levitation furnace according to an embodiment of the present invention will now be described by referring to the accompanying drawings.

Figure 1:
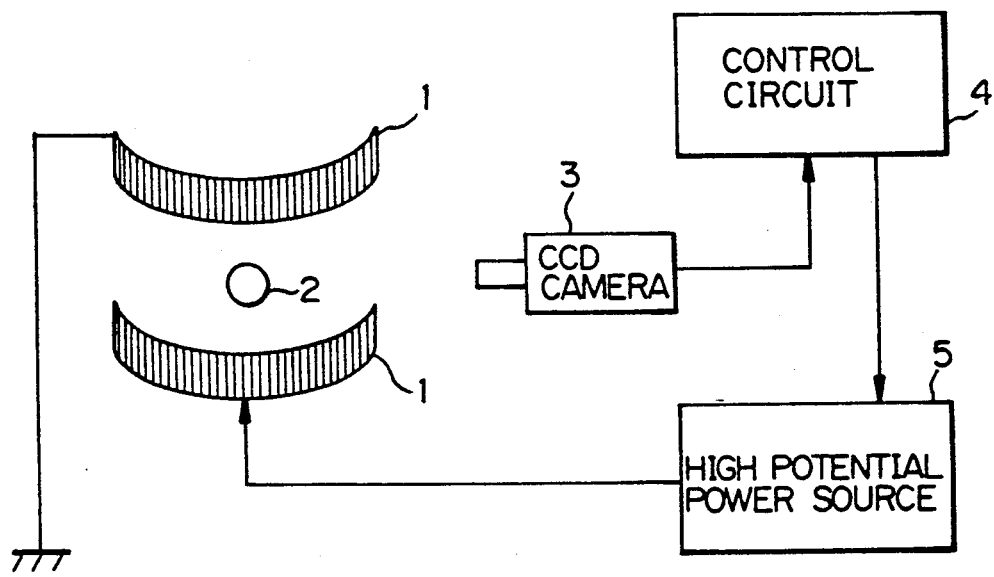
FIG. 1 is a block diagram illustrating the constitution of an electrostatic levitation furnace according to a prior art.
Figure 2:
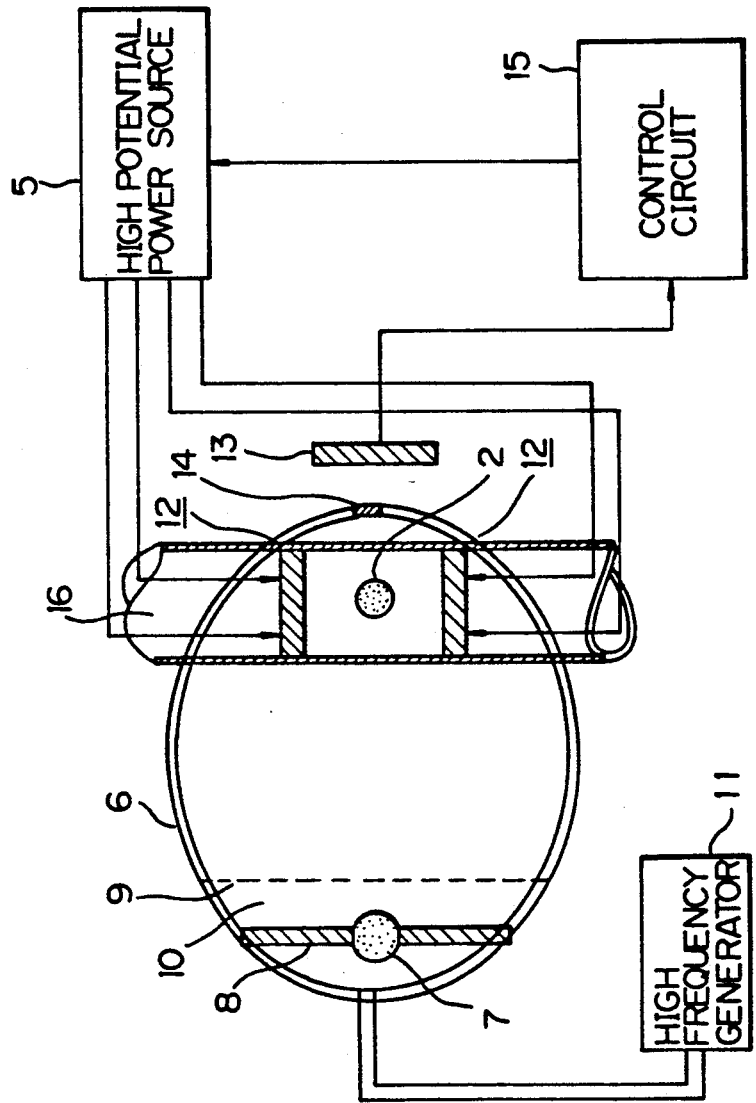
FIG. 2 is a block diagram illustrating a first embodiment of the present invention.

FIG. 2 is a block diagram illustrating a first embodiment of the present invention and a test sample 2 and a high potential power source 5 are exactly the same as those described in connection with a prior art.

Figure 3:
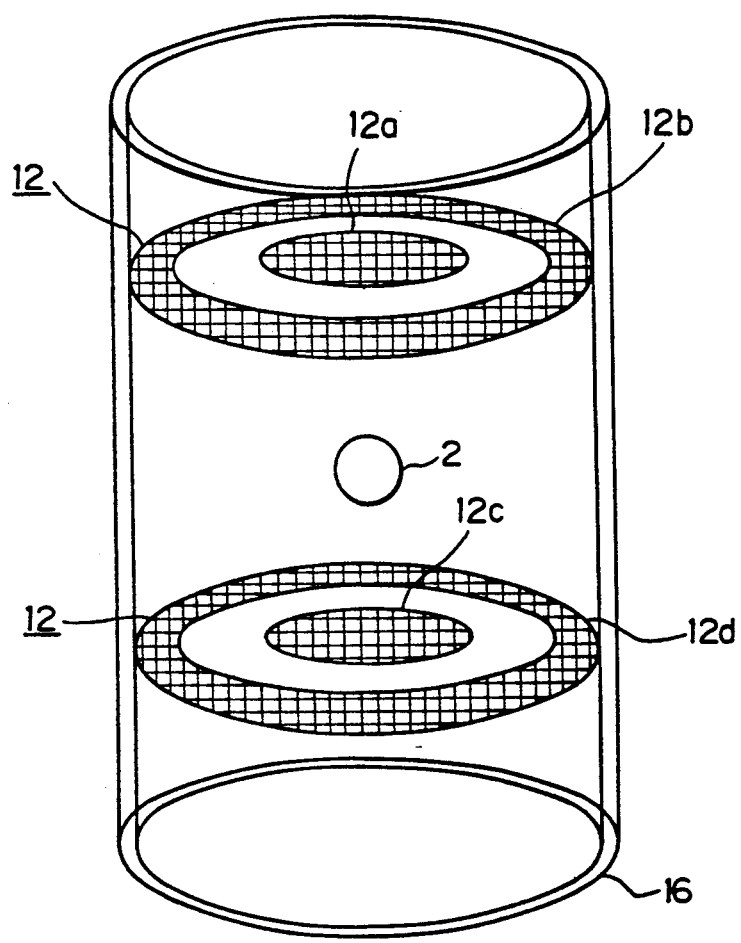
FIG. 3 schematically illustrates the arrangement of transparent plate electrodes and a test sample in the first embodiment shown in FIG. 2.

In FIG. 2, numeral 6 designates a rotary elliptical mirror having a reflection surface at the inside in the form of a rotary elliptical body, numeral 7 a plasma lamp disposed at a first focal point of the rotary elliptical mirror 6, numeral 8 a support adapted to support the plasma lamp 7, numeral 9 an electric wave shielding plate of a disc type secured to the mirror at the side of the first focal point with the circumferential edge contacting with the inside surface of the mirror, numeral 10 a cavity resonator defined by the electric wave shielding plate 9 and the rotary elliptical mirror 6, numeral 11 a high frequency generator adapted to apply a high frequency current to the cavity resonator 10 accommodating the plasma lamp 7, numeral 12 transparent plate electrodes comprising a pair of opposed disc-shaped electrodes and a pair of ring-shaped opposed electrodes concentric with the pair of disc-shaped electrodes, numeral 13 a position detector adapted to measure the position of the test sample 2 by observing through the observation hole 14 which is provided through the rotary elliptical mirror 6 and is arranged in the opposed relationship with the test sample 2, and numeral 15 a control circuit connected to the position detector 13 and the high potential power source 5. FIG. 3 illustrates the relationship between the transparent plate electrodes 12 and the test sample 2. Numerals 12b and 12d designate outer transparent ring electrodes and numerals 12a and 12c designate inner transparent disc electrodes. The test sample is levitated among these electrodes. Numeral 16 designates a transparent hollow cylindrical silica tube which accommodates therein the transparent plate electrodes 12 and the test sample 2.

Figure 4:
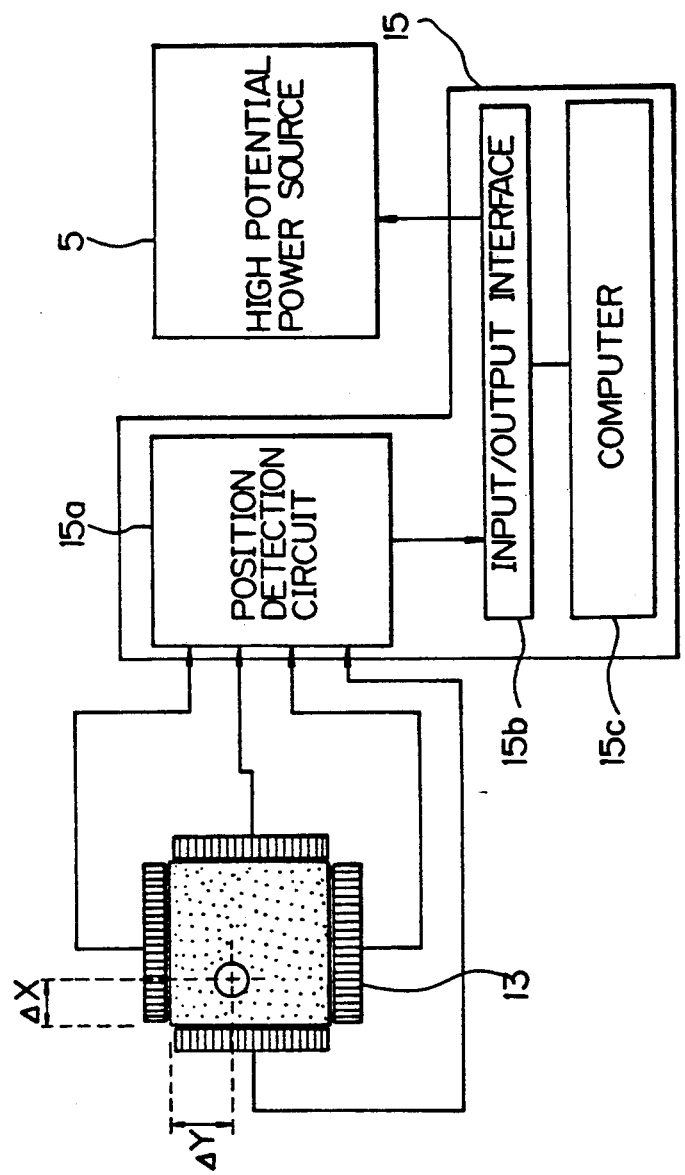
FIG. 4 is a block diagram illustrating the constitution of an electric field control system according to the present invention, comprising a position detector, a control circuit and a high potential power source.

FIG. 4 is a block diagram illustrating the constitution of the position detector 13 and the control circuit 15. The position detector 13 which may be formed by a p-n junction silicon semiconductor in the form of a sheet and have the size of approximately 5 cm square, outputs an X-position signal and a Y-position signal and then applies them to a position detection circuit 15a. The X- and Y-position signals represent respectively the positions of the test sample in the X and Y directions on the position detector. Then, the position signals are applied through an input/output interface 15b to a computer 15c.

Figure 5:
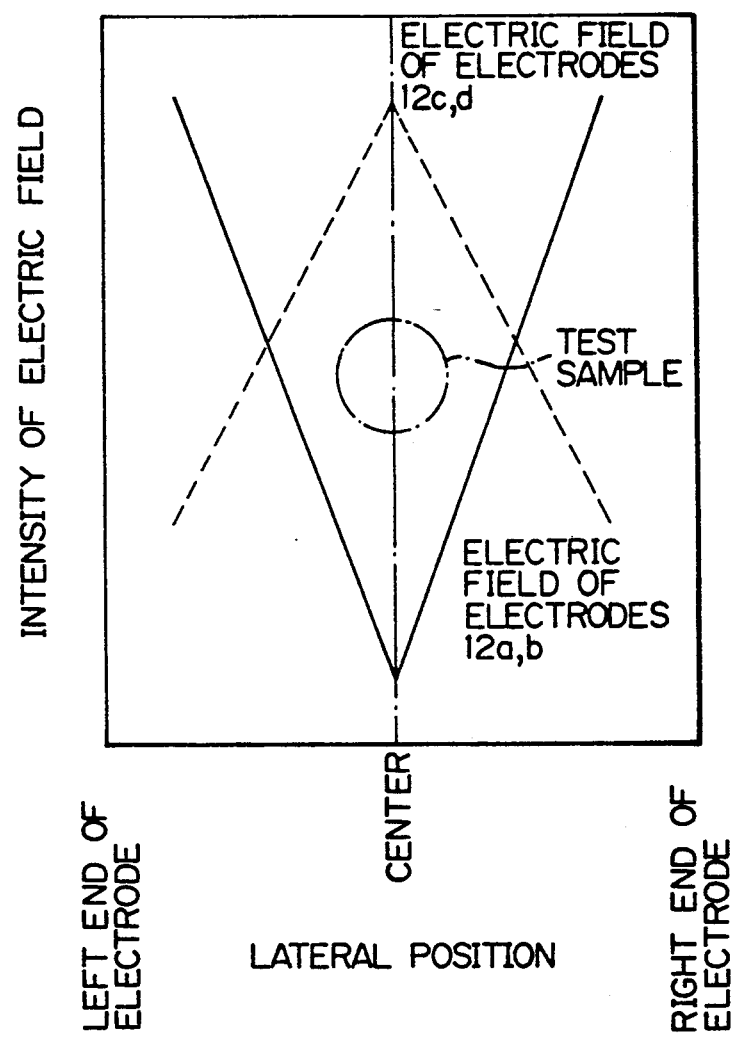
FIG. 5 is a diagram explaining the principle of levitation of the test sample in the first embodiment shown in FIGS. 2 and 3.

In the electrostatic levitation furnace constituted as described above, when the test sample 2 which has been suitably positioned is heated by the plasma lamp 7 to approximately 500° C., a voltage is applied across the transparent plate electrodes 12 from the high potential power source 5 so as to cause the test sample 2 to be levitated in the electrostatic field. This principle is illustrated in FIG. 5. The transparent plate electrodes 12 generate a valley type electric field and the test sample 2 is levitated in the valley by Coulomb's force. Then, the position of the levitated test sample is detected by the position detector 13 and transmitted to the control circuit 15 in the form of analog signals. A control operation is executed in the control circuit and then the controlled value is transmitted to the high potential power source 5. In this way, a position control can be performed at a high speed.

The light from the plasma lamp 7 is condensed onto the levitated test sample 2 which is then heated. At this time, depending on the method of treating the material in question, the atmospheric control may be executed by removing the atmosphere to generate vacuum or injecting gases such as oxygen or the like. This atmospheric control is done in the silica tube 16.

Figure 6:
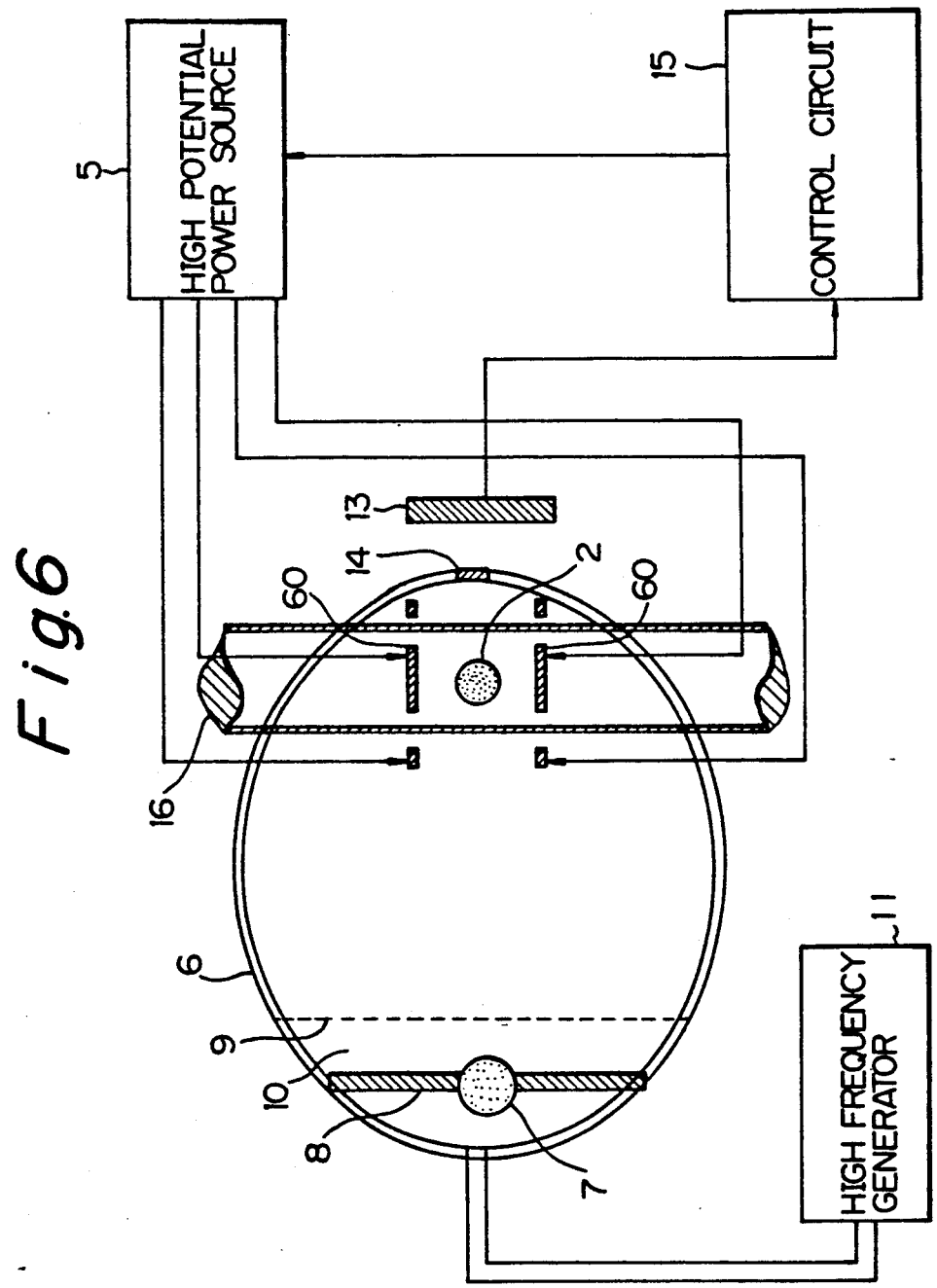
FIG. 6 is a block diagram illustrating the constitution of an electrostatic levitation furnace according to a second embodiment of the present invention.

FIG. 6 is a block diagram illustrating the constitution of a second embodiment of the present invention. The second embodiment of the present invention is composed of the same components as those used in the first embodiment except for the constitution of the electrodes which provide the electrostatic field allowing the test sample 2 to be levitated.

In FIG. 6, numeral 60 designates transparent plate electrodes comprising a pair of opposed disc electrodes and a pair of opposed ring electrodes concentric with the pair of disc electrodes.

Figure 7:
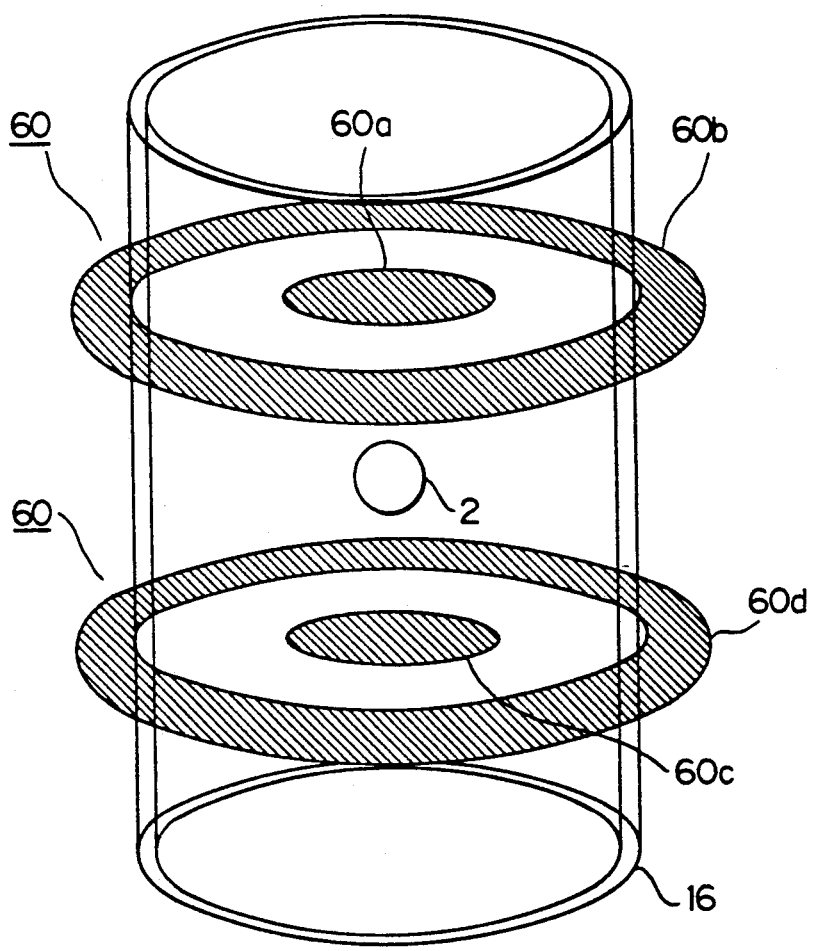
FIG. 7 schematically illustrates the arrangement of transparent plate electrodes and a test sample in the second embodiment shown in FIG. 6.

FIG. 7 illustrates a relationship between the transparent plate electrodes 60 and the test sample 2. Numerals 60b and 60d designate outer transparent ring electrodes disposed outwardly of the silica tube 16. Numerals 60a and 60c designate inner transparent disc electrodes disposed inwardly of the silica tube 16. The test sample 2 is levitated between the upper and lower inner transparent disc electrodes. Numeral 16 is the silica tube which is transparent and of a hollow cylindrical shape. The inner transparent disc electrodes 60a and 60c and the test sample 2 are accommodated inside of the silica tube.

Figure 8:
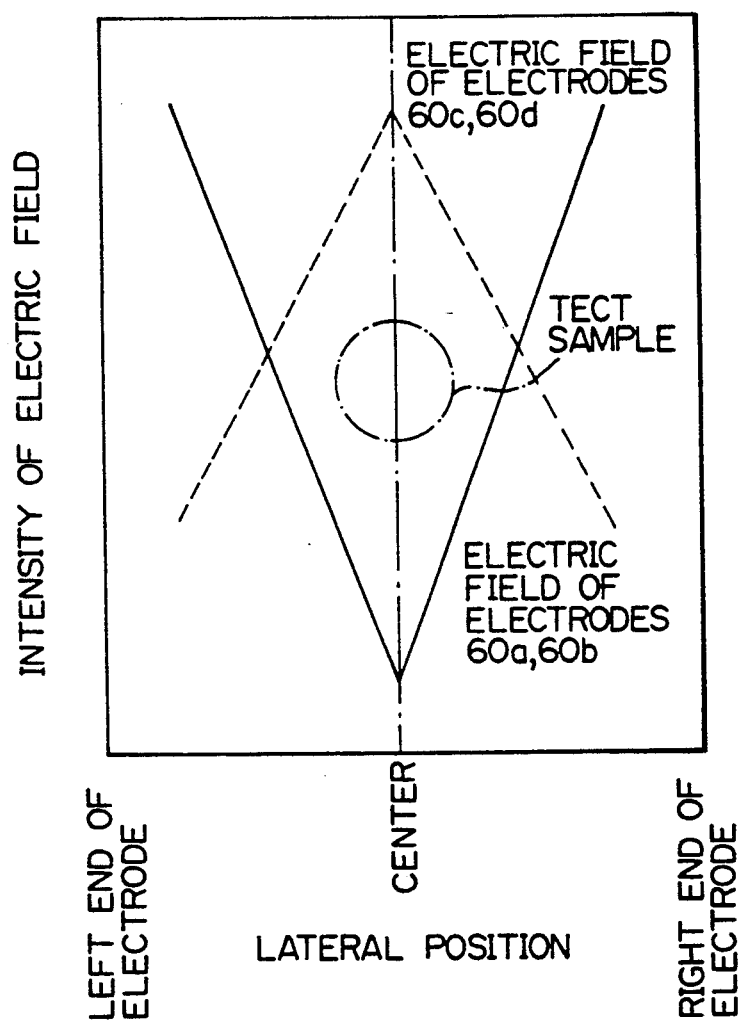
FIG. 8 is a diagram explaining the principle of levitation of the test sample in the second embodiment shown in FIGS. 6 and 7.

The principle of causing the test sample to be levitated in the electrostatic field is illustrated in FIG. 8. The transparent plate electrodes 60 generate a valley type electric field and the test sample 2 is levitated in the valley by Coulomb's force.

Figure 9:
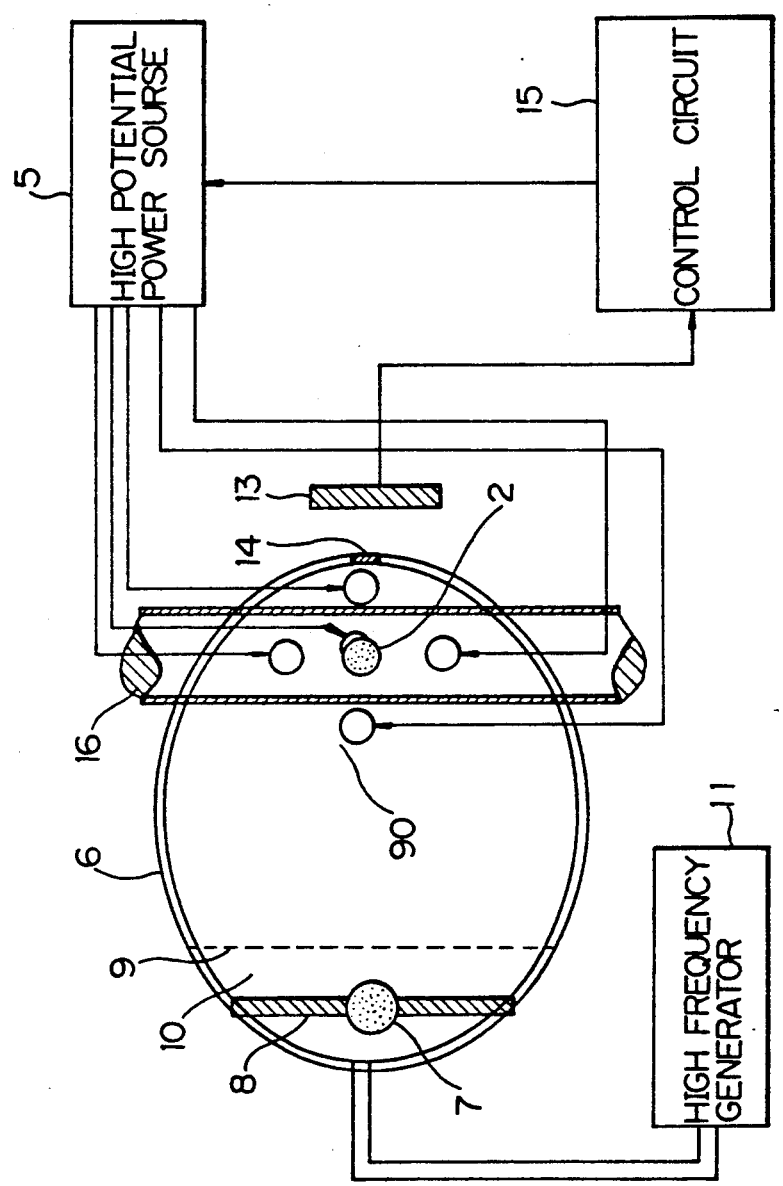
FIG. 9 is a block diagram illustrating the constitution of an electrostatic levitation furnace according to a third embodiment of the present invention.

FIG. 9 is a block diagram illustrating a third embodiment of the present invention. According to the third embodiment, the same components as those employed in the first and second embodiments are used except for the constitution of the electrodes which provide the electrostatic field allowing the test sample 2 to be levitated.

In FIG. 9, numeral 90 designates transparent spherical electrodes which are consisted of five spherical e electrodes 90a through 90e attached to the spherical glass or ceramic material and disposed at the apexes of a regular hexahedron.

Figure 10:
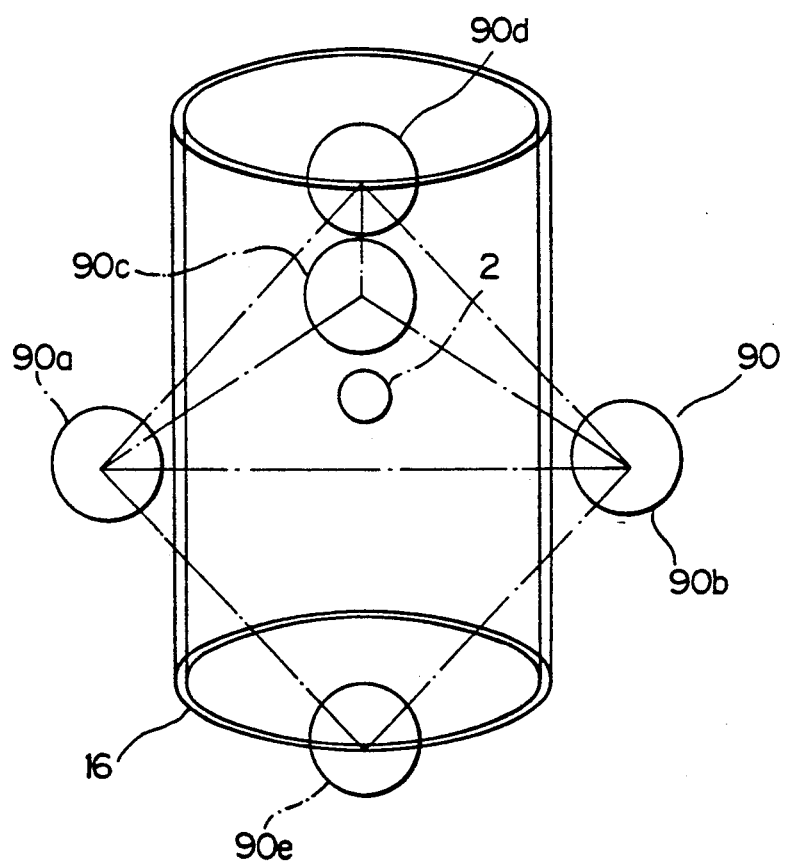
FIG. 10 schematically illustrates the arrangement of transparent spherical electrodes and a test sample in the third embodiment shown in FIG. 9.

FIG. 10 illustrates a relationship between the transparent spherical electrodes 90 and the test sample 2. The five transparent spherical electrodes 90a through 90e are disposed at the apexes of the hexahedron and the test sample 2 is caused to be levitated at the center of such electrodes. The three transparent spherical electrodes 90a, 90b and 90c are disposed outwardly of the silica tube 16. The silica tube 16 is adapted to accommodate the two inner transparent spherical electrodes 90d and 90e as well as the test sample 2.

Figure 11:
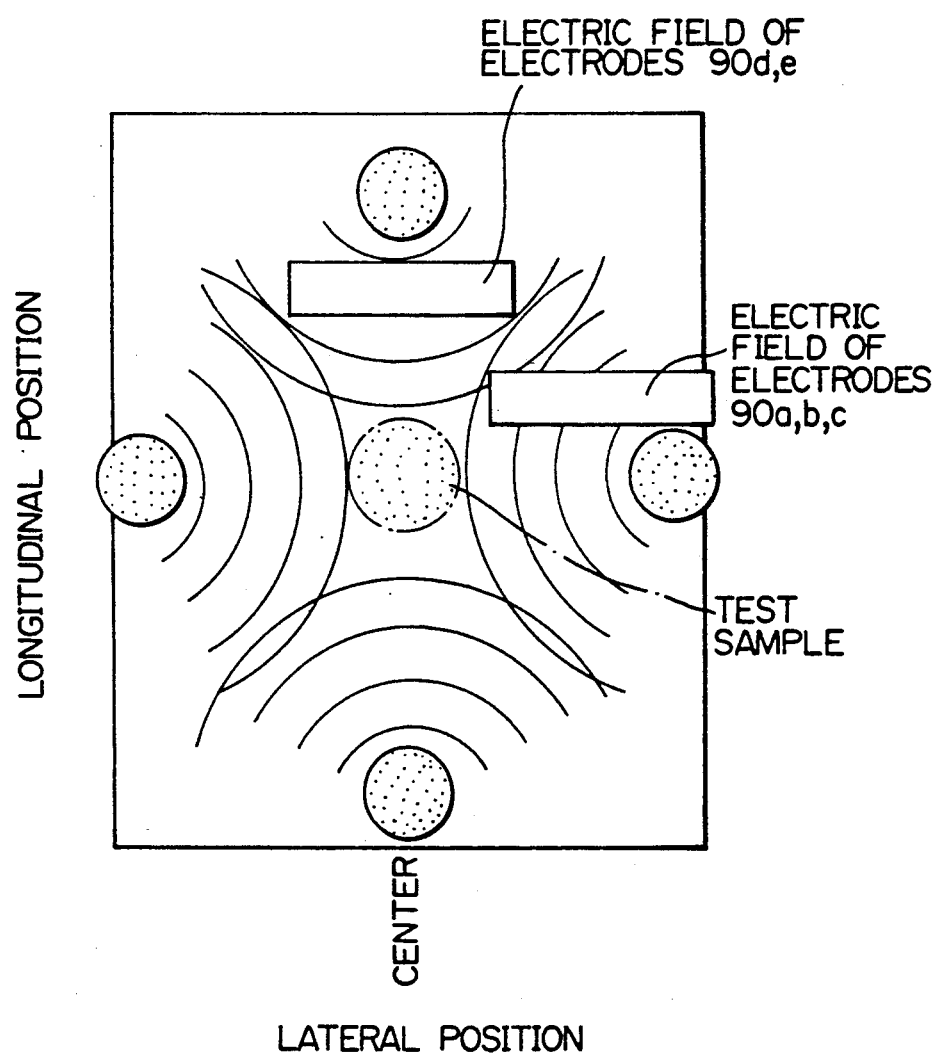
FIG. 11 is a diagram explaining the principle of levitation of the test sample in the third embodiment shown in FIGS. 9 and 10.

The principle of levitating the test sample 2 in the electrostatic field is illustrated in FIG. 11. The transparent spherical electrodes 90 generate a valley type electric field and the test sample 2 is levitated in the valley by Coulomb's force.

Figure 12:
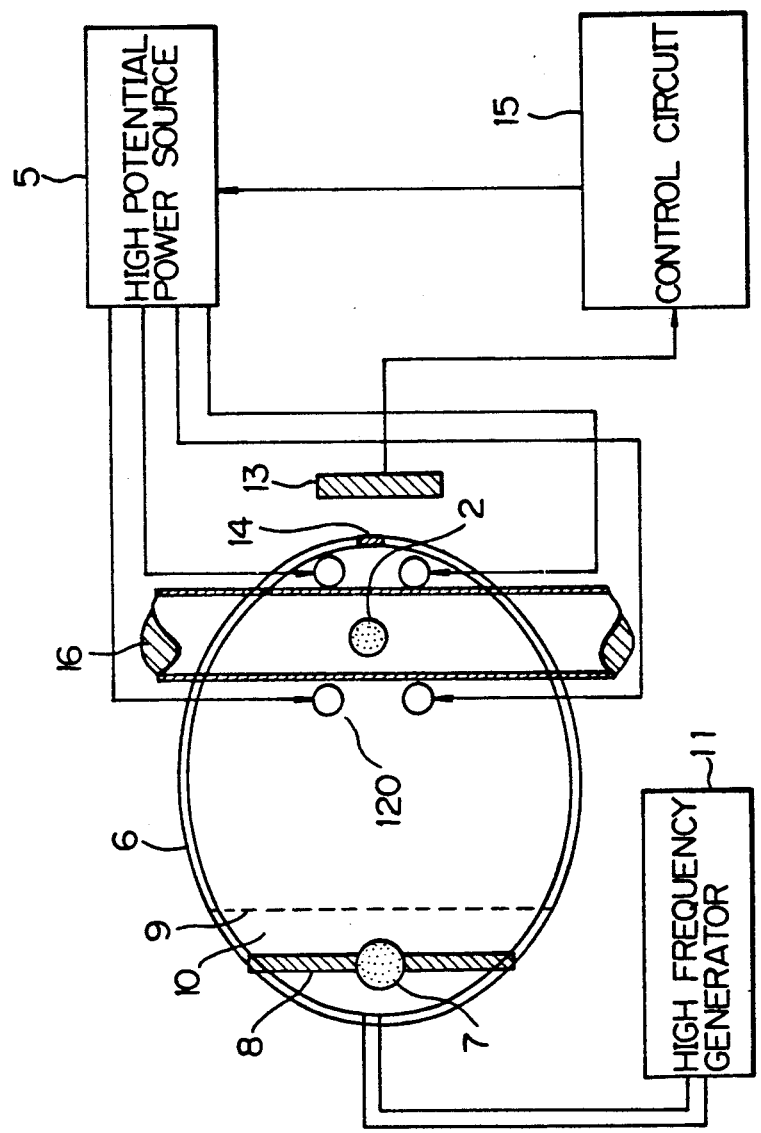
FIG. 12 is a block diagram illustrating the constitution of an electrostatic levitation furnace according to a fourth embodiment of the present invention.

FIG. 12 is a block diagram showing the constitution of a fourth embodiment of the present invention. The fourth embodiment is composed of the same components as those used in the first embodiment through the third embodiment except for the constitution of the electrodes which provide the electrostatic field allowing the test sample to be levitated.

In FIG. 12, numeral 120 designates transparent spherical electrodes which are attached to the spherical glass or ceramic material and comprised of eight electrodes 120a through 120h, four of which are not shown.

Figure 13:
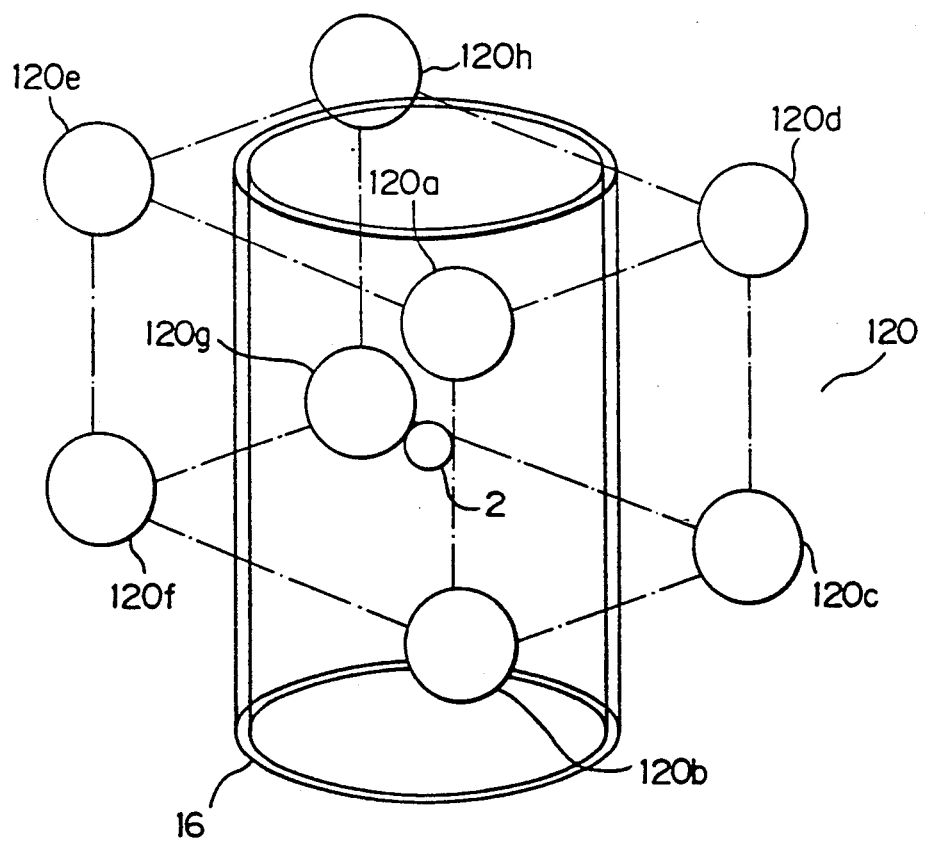
FIG. 13 schematically illustrates the arrangement of transparent spherical electrodes and a test sample in the fourth embodiment shown in FIG. 12.

FIG. 13 illustrates a relationship between the transparent spherical electrodes 120 and the test sample 2. The eight transparent spherical electrodes 120a through 120h are disposed at the apexes of a cube outwardly of the silica tube 16 and the test sample 2 is caused to float centrally of the transparent spherical electrodes disposed at the respective apexes.

Figure 14:
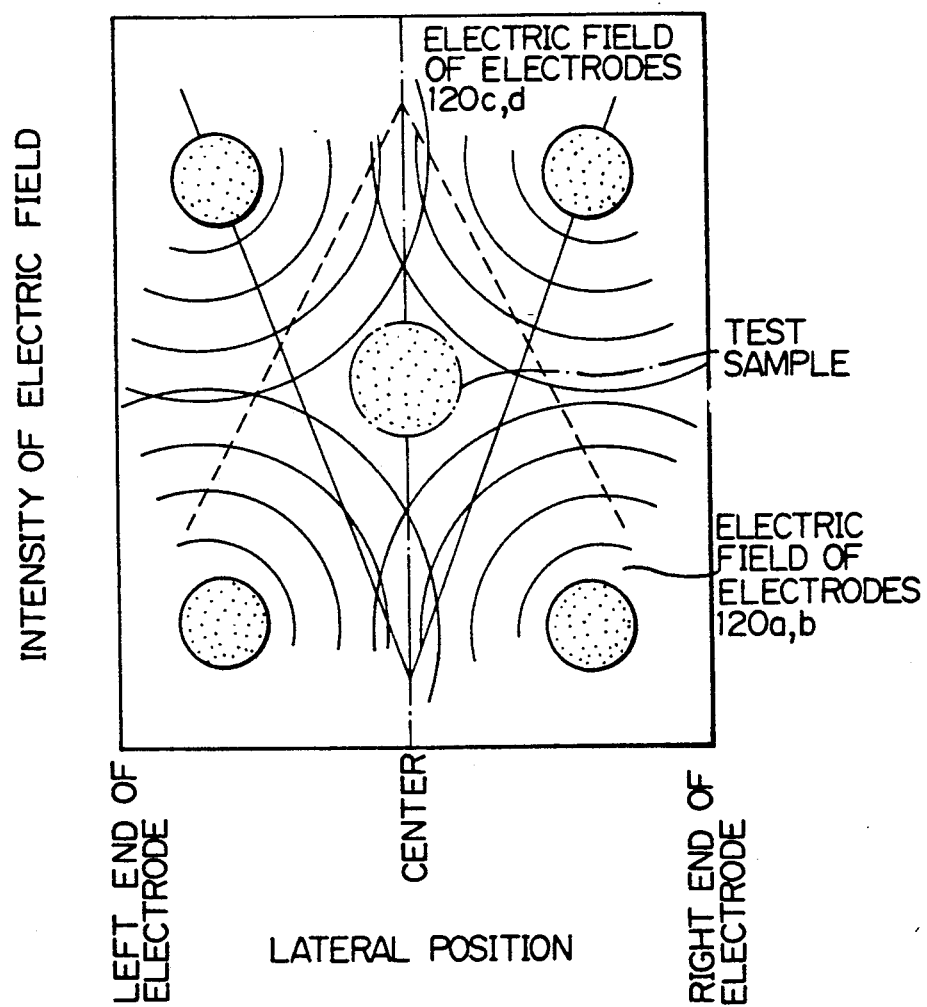
FIG. 14 is a diagram explaining the principle of levitation of the test sample in the fourth embodiment shown in FIGS. 12 and 13.

The principle of levitating the test sample 2 in the electrostatic field is shown in FIG. 14. The transparent spherical electrodes 120 generate a valley type electric field and the test sample 2 is levitated in the valley by Coulomb's force.

Figure 15:
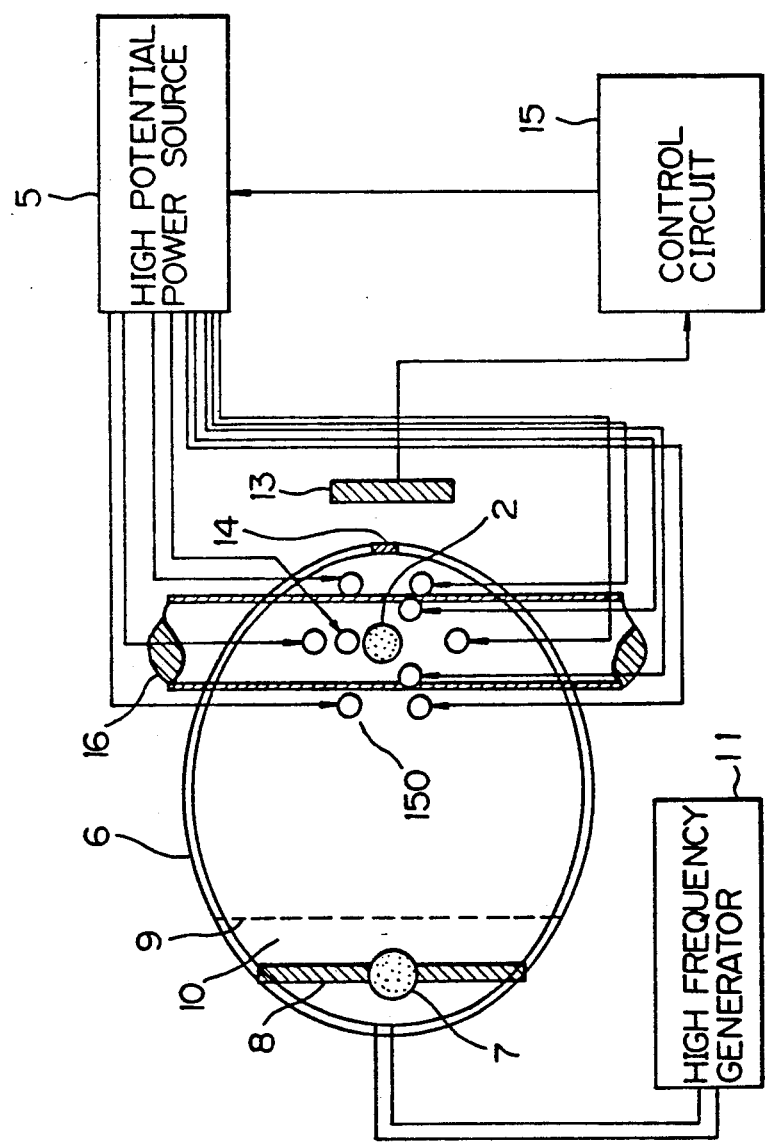
FIG. 15 is a block diagram illustrating the constitution of an electrostatic levitation furnace according to a fifth embodiment of the present invention.

FIG. 15 is a block diagram illustrating a fifth embodiment of the present invention. The fifth embodiment is also comprised of the same components as those used in the first embodiment through the fourth embodiment except for the constitution of the electrostatic field allowing the test sample 2 to be levitated.

In FIG. 15, numeral 150 designates transparent spherical electrodes which are attached to spherical glass or ceramic material and comprised of twelve electrodes 150a through 150l, three of which are not shown, disposed at the apexes of a regular icosahedron.

Figure 16:
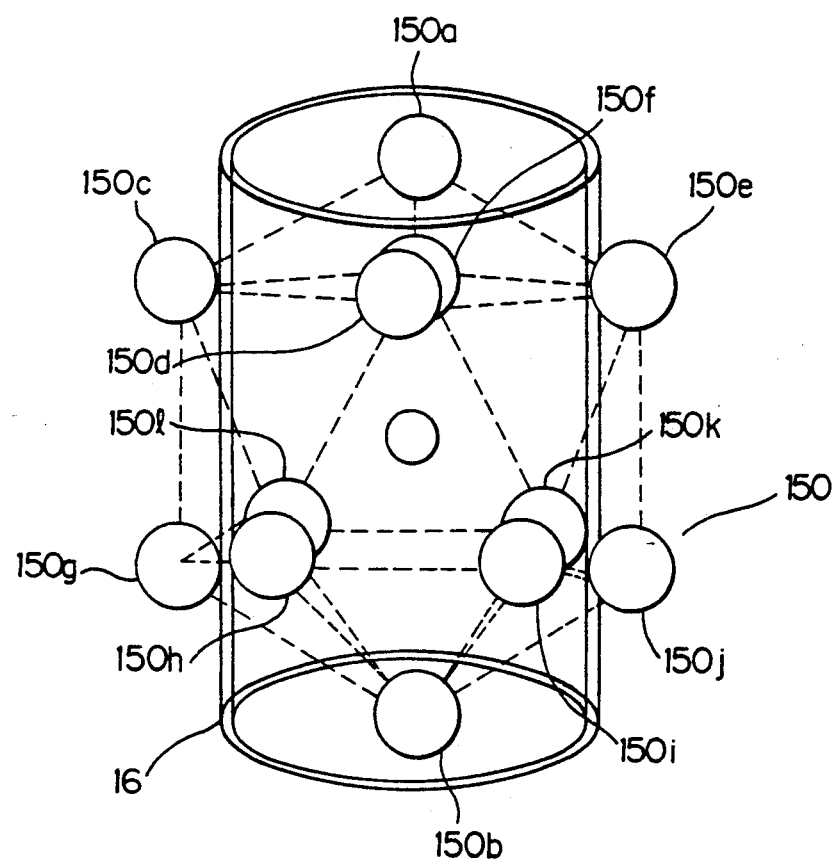
FIG. 16 schematically illustrates the arrangement of transparent spherical electrodes and a test sample in the fifth embodiment shown in FIG. 15.

FIG. 16 illustrates the relationship between the transparent spherical electrodes 150 and the test sample 2. The twelve transparent spherical electrodes 150a through 150l are respectively disposed at the apexes of the icosahedron and the test sample 2 is caused to be levitated at the center of such electrodes. The ten transparent spherical electrodes 150c through 150l are disposed outwardly of the silica tube 16. The silica tube 16 is adapted to accommodate the two inner transparent spherical electrodes 150a and 150b and the test sample 2.

Figure 17:
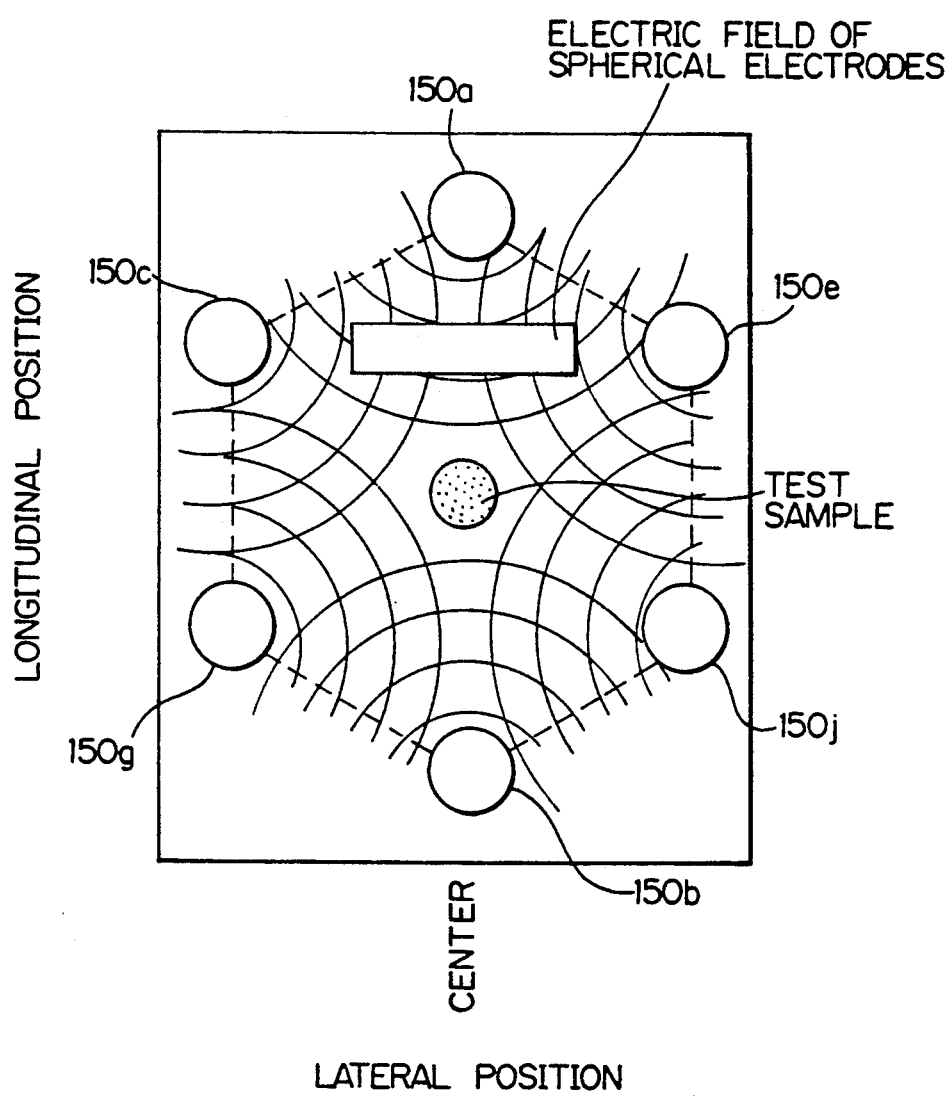
FIG. 17 is a diagram explaining the principle of levitation of the test sample in the fifth embodiment shown in FIGS. 15 and 16.

The principle of levitating the test sample 2 in the electrostatic field is shown in FIG. 17. The transparent spherical electrodes 150 generate a valley type electric field and the test sample 2 is levitated in the valley by Coulomb's force.

As explained, the first embodiment through the fifth embodiment of the present invention employ a rotary elliptical mirror 6. However, according to embodiments respectively shown in FIG. 18 through FIG. 22, a second rotary elliptical mirror 17 is so attached as to share a second focal point of the first rotary elliptical mirror in the direction of the major axis. At the end of the second rotary elliptical mirror 17, there are attached the plasma lamp 7, the supporting member 8 and the electric wave shielding plate 9. The light emitted from both plasma lamps 7 is evenly irradiated on the entire surface of the test sample 2. Therefore, a better heating effect can be attained.

The sixth embodiment shown in FIG. 18 provides an electrostatic levitation furnace which employs the transparent plate electrodes 12 used in the first embodiment as shown in FIG. 2 and FIG. 3 as the electrodes which provide the electric field allowing the test sample 2 to be levitated.

The seventh embodiment shown in FIG. 19 provides an electrostatic levitation furnace which employs the transparent plate electrodes 60 used in the second embodiment as shown in FIG. 6 and FIG. 7.

The eighth embodiment shown in FIG. 20 provides an electrostatic levitation furnace which employs the transparent spherical electrodes 90 used in the third embodiment as shown in FIG. 9 and FIG. 10.

The ninth embodiment shown in FIG. 21 provides an electrostatic levitation furnace which employs the transparent spherical electrodes 120 used in the fourth embodiment shown in FIG. 12 and FIG. 13.

The tenth embodiment shown in FIG. 22 provides an electrostatic levitation furnace which employs the transparent spherical electrodes 150 used in the fifth embodiment shown in FIG. 15 and FIG. 16.

What is claimed is:

1. An electrostatic levitation furnace capable of being used in the production of microgravity materials comprising:
    rotary elliptical mirror means having a reflection surface of a rotary elliptical body at the inside;
    plasma lamp means disposed at a first focal point of said rotary elliptical mirror means;
    means for supporting said plasma lamp means;
    electric wave shielding plate means of a disc type attached adjacent to said first focal point of said rotary elliptical mirror in such a manner as the circumferential edge of the plate means is in contact with the inner surface of said mirror;
    cavity resonator means defined by said rotary elliptical mirror and said electric wave shielding plate, and adapted to accommodate said plasma lamp means;
    high frequency generator means for supplying a high frequency current to said cavity resonator means;
    a test sample disposed at a second focal point of said rotary elliptical mirror means;
    transparent electrode means disposed in said rotary elliptical mirror means for providing an electric field allowing said test sample to be levitated;
    high potential power source means connected to said transparent electrode means;
    position detector means disposed opposedly to said test sample for detecting the position thereof;
    control means connected to said position detector means and said high potential power source means for controlling an output level of said high potential power source means in response to the detected position of said test sample; and
    means for accommodating said test sample.

2. An electrostatic levitation furnace as claimed in claim 1 characterized in that said transparent electrode means is disposed within said accommodating means, and comprises a pair of opposed transparent disc electrodes and a pair of opposed transparent ring electrodes disposed concentrically relative to said pair of said transparent disc electrodes.

3. An electrostatic levitation furnace as claimed in claim 1 characterized in that said transparent electrode means comprises a pair of opposed transparent disc electrodes disposed within said accommodating means and a pair of opposed transparent ring electrodes disposed outwardly of said accommodating means and concentrically relative to said transparent disc electrodes.

4. An electrostatic levitation furnace as claimed in claim 1 characterized in that said transparent electrode means comprises a plurality of transparent spherical electrodes disposed inwardly of said accommodating means and a plurality of transparent spherical electrodes disposed outwardly of said accommodating means.

5. An electrostatic levitation furnace as claimed in claim 1 characterized in that said transparent electrode means comprises two transparent spherical electrodes disposed inwardly of said accommodating means and three transparent spherical electrodes disposed outwardly of said accommodating means, five in total of said transparent spherical electrodes being disposed at the apexes of an imaginary regular hexahedron with said test sample being centrally positioned within said hexahedron.

6. An electrostatic levitation furnace as claimed in claim 1 characterized in that said transparent electrode means comprises eight transparent spherical electrodes disposed outwardly of said accommodating means, said transparent spherical electrodes being disposed at the apexes of an imaginary cube with said test sample being centrally positioned within said cube.

7. An electrostatic levitation furnace as claimed in claim 1 characterized in that said transparent electrode means comprises two transparent spherical electrodes disposed inwardly of said accommodating means and ten transparent spherical electrodes disposed outwardly of said accommodating means, twelve in total of said transparent spherical electrodes being disposed at the apexes of an imaginary regular icosahedron with said test sample being centrally positioned within said icosahedron.

8. An electrostatic levitation furnace capable of being used for production of microgravity materials comprising:
    first rotary elliptical mirror means having a reflection surface of a rotary elliptical body at the inside;
    second rotary elliptical mirror means having a reflection surface of a rotary elliptical body at the inside and sharing a second focal point of said first rotary elliptical mirror means;
    first and second plasma lamp means disposed respectively at first focal points of said first and second rotary elliptical mirror means;
    first and second means for supporting said first and second plasma lamp means, respectively;
    first and second electric wave shielding plate means of a disc type attached adjacent to said first focal points respectively of said first and second rotary elliptical mirror means in a manner as the circumferential edges of the shielding plate means are respectively in contact with the inner surfaces of said first and second rotary elliptical mirror means;
    first and second cavity resonator means respectively defined by said first and second rotary elliptical mirror means and said first and second electric wave shielding plate means and adapted to accommodate respectively said first and second plasma lamp means;
    high frequency generator means for supplying a high frequency current to said first and second cavity resonator means;

a test sample disposed at the second focal point common to said first and second rotary elliptical mirror means;

transparent electrode means disposed in said first and second rotary elliptical mirror means and for providing an electric field allowing said test sample to be levitated;

high potential power source means connected to said transparent electrode means;

position detector means disposed opposedly to said test sample for detecting the position of said test sample;

control means connected to said position detector means and said high potential power source means for controlling an output level of said high potential power source means in response to the detected position of said test sample; and means for accommodating said test sample.

9. An electrostatic levitation furnace as claimed in claim 8 characterized in that said transparent electrode means is disposed within said accommodating means, and comprises a pair of opposed transparent disc electrodes and a pair of opposed transparent ring electrodes disposed concentrically relative to said pair of said transparent disc electrodes.

10. An electrostatic levitation furnace as claim in claim 8 characterized in that said transparent electrode means comprises a pair of opposed transparent disc electrodes disposed within said accommodating means and a pair of opposed transparent ring electrodes disposed outwardly of said accommodating means and concentrically relative to said transparent disc electrodes.

11. An electrostatic levitation furnace as claimed in claim 8 characterized in that said transparent electrode means comprises a plurality of transparent spherical electrodes disposed inwardly of said accommodating means and a plurality of transparent spherical electrodes disposed outwardly of said accommodating means.

12. An electrostatic levitation furnace as claimed in claim 8 characterized in that said transparent electrode means comprises two transparent spherical electrodes disposed inwardly of said accommodating means and three transparent spherical electrodes disposed outwardly of said accommodating means, five in total of said transparent spherical electrodes being disposed at the apexes of an imaginary regular hexahedron with said test sample being centrally positioned within said hexahedron.

13. An electrostatic levitation furnace as claimed in claim 8 characterized in that said transparent electrode means comprises eight transparent spherical electrodes disposed outwardly of said accommodating means, said transparent spherical electrodes being disposed at the apexes of an imaginary cube with said test sample being centrally positioned within said cube.

14. An electrostatic levitation furnace as claimed in claim 8 characterized in that said transparent electrode means comprises two transparent spherical electrodes disposed inwardly of said accommodating means and ten transparent spherical electrodes disposed outwardly of said accommodating means, twelve in total of said transparent spherical electrodes being disposed at the apexes of an imaginary regular icosahedron with said test sample being centrally positioned within said icosahedron.

15. An electrostatic levitation furnace for use in the production of microgravity materials comprising:

a test sample;

means for accommodating said test sample;

means, coupled to said accommodating means, for positioning said test sample within said accommodating means; and means, coupled to said accommodating means, for rotatably heating said test sample, said means for rotatably heating comprising a rotary elliptical mirror means having a reflective surface or an interior surface thereof for generating a spherical focussed image, and, an electric wave shielding plate disposed in the interior of said elliptical mirror means, said shielding plate having a circumferential edge contacting the interior of the elliptical mirror means to form a resonation cavity therewith.

16. An electrostatic levitation furnace as claimed in claim 15 wherein said means for rotatably heating said test sample further comprises:

a plasma lamp disposed in the interior of said elliptical mirror means adjacent said shielding plate at a first focal point; and a high frequency generator means for supply a high frequency current to said resonation cavity;

said accommodating means and said test sample disposed at a second focal point of said rotary elliptical mirror means.

17. An electrostatic levitation furnace as claimed in claim 16 wherein said means for rotatably heating said test sample further comprises:

a second rotary elliptical mirror means having a reflective surface on an interior surface thereof for generating a spherical focussed image;

a second plasma lamp disposed in the interior of said second elliptical mirror means at a first focal point;

a second electric wave shielding plate disposed adjacent said second plasma lamp in the interior of said second elliptical mirror means, the circumferential edge of said shielding plate contacting the interior surface of said second elliptical mirror means to form a second resonation cavity in which said second plasma lamp is disposed;

a second high frequency generator means for supplying a high frequency current to said second resonation cavity;

said accommodating means and said test sample disposed at a second focal point of said second rotary elliptical mirror means.

18. An electrostatic levitation furnace as claimed in claims 16 or 17 wherein said means for positioning said test sample comprises:

transparent electrode means for providing an electric field to levitate said test sample;

a high potential power source, coupled to said transparent electrode means;

position detector means disposed oppositely said test sample for detecting the position of said test sample;

control means, responsive to said position detector means, for controlling the output level of said high potential power source.

19. An electrostatic levitation furnace as claimed in claim 18 characterized in that said transparent electrode means is disposed within said accommodating means, and comprises a pair of opposed transparent disc electrodes and a pair of opposed transparent ring electrodes disposed concentrically relative to said pair of said transparent disc electrodes.

20. An electrostatic levitation furnace as claim in claim 18 characterized in that said transparent electrode means comprises a pair of opposed transparent disc electrodes disposed within said accommodating means and a pair of opposed transparent ring electrodes disposed outwardly of said accommodating means and concentrically relative to said transparent disc electrodes.

21. An electrostatic levitation furnace as claimed in claim 18 characterized in that said transparent electrode means comprises a plurality of transparent spherical electrodes disposed inwardly of said accommodating means and a plurality of transparent spherical electrodes disposed outwardly of said accommodating means.

22. An electrostatic levitation furnace as claimed in claim 18 characterized in that said transparent electrode means comprises two transparent spherical electrodes disposed inwardly of said accommodating means and three transparent spherical electrodes disposed outwardly of said accommodating means, five in total of said transparent spherical electrodes being disposed at the apexes of an imaginary regular hexahedron with said test sample being centrally positioned within said hexahedron.

23. An electrostatic levitation furnace as claimed in claim 18 characterized in that said transparent electrode means comprises eight transparent spherical electrodes disposed outwardly of said accommodating means, said transparent spherical electrodes being disposed at the apexes of an imaginary cube with said test sample being centrally positioned within said cube.

24. An electrostatic levitation furnace as claimed in claim 18 characterized in that said transparent electrode means comprises two transparent spherical electrodes disposed inwardly of said accommodating means and ten transparent spherical electrodes disposed outwardly of said accommodating means, twelve in total of said transparent spherical electrodes being disposed at the apexes of an imaginary regular icosahedron with said test sample being centrally positioned within said icosahedron.

* * * * *